United States Patent
Jung et al.

(10) Patent No.: US 7,767,512 B2
(45) Date of Patent: Aug. 3, 2010

(54) METHODS OF MANUFACTURING A SEMICONDUCTOR DEVICE INCLUDING CMOS TRANSISTOR HAVING DIFFERENT PMOS AND NMOS GATE ELECTRODE STRUCTURES

(75) Inventors: Hyung-Suk Jung, Suwon-si (KR); Jong-Ho Lee, Suwon-si (KR); Sung-Kee Han, Seongnam-si (KR); Yun-Ki Choi, Seoul (KR); Ha Jin Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 182 days.

(21) Appl. No.: 12/019,449

(22) Filed: Jan. 24, 2008

(65) Prior Publication Data

US 2008/0261360 A1 Oct. 23, 2008

(30) Foreign Application Priority Data

Jan. 24, 2007 (KR) .................. 10-2007-0007278

(51) Int. Cl.
*H01L 21/8238* (2006.01)
(52) U.S. Cl. .................. 438/199; 438/149; 438/197; 257/E21.635; 257/E27.064
(58) Field of Classification Search .................. 438/199, 438/149, 197; 257/E21.635, E27.064
See application file for complete search history.

(56) References Cited

U.S. PATENT DOCUMENTS

| | | | |
|---|---|---|---|
| 6,794,234 B2 * | 9/2004 | Polishchuk et al. | 438/199 |
| 2003/0203560 A1 * | 10/2003 | Ryu et al. | 438/218 |
| 2004/0245578 A1 * | 12/2004 | Park et al. | 257/369 |
| 2006/0030097 A1 * | 2/2006 | Jeon et al. | 438/199 |
| 2006/0105521 A1 * | 5/2006 | Won et al. | 438/253 |
| 2007/0015372 A1 * | 1/2007 | Yoon et al. | 438/745 |
| 2007/0034966 A1 * | 2/2007 | Kim et al. | 257/369 |
| 2007/0178634 A1 * | 8/2007 | Jung et al. | 438/199 |
| 2007/0178663 A1 * | 8/2007 | Kim | 438/424 |
| 2008/0099851 A1 * | 5/2008 | Hsu et al. | 257/369 |

FOREIGN PATENT DOCUMENTS

| | | |
|---|---|---|
| JP | 2006-80355 | 3/2006 |
| KR | 10-2005-0112114 | 11/2005 |

OTHER PUBLICATIONS

English Abstract Publication No. 2006-080355.
English Abstract Publication No. 2005-0112114.

* cited by examiner

*Primary Examiner*—Thanh V Pham
*Assistant Examiner*—Duy T Nguyen
(74) *Attorney, Agent, or Firm*—F. Chau & Associates, LLC

(57) ABSTRACT

In a method of manufacturing a semiconductor device, a gate insulation layer is formed on a substrate including a first channel of a first conductive type and a second channel of a second conductive type different from the first conductive type. A first conductive layer including a first metal is formed on the gate insulation layer, and a second conductive layer including a second metal different from the first metal is formed on the first conductive layer formed over the second channel. The second conductive layer is partially removed by a wet etching process to form a second conductive layer pattern over the second channel.

12 Claims, 6 Drawing Sheets

METHODS OF MANUFACTURING A SEMICONDUCTOR DEVICE INCLUDING CMOS TRANSISTOR HAVING DIFFERENT PMOS AND NMOS GATE ELECTRODE STRUCTURES

CROSS-REFERENCE TO RELATED APPLICATIONS

This application claims priority under 35 U.S.C. §119 to Korean Patent Application No. 2007-7278, filed on Jan. 24, 2007 in the Korean Intellectual Property Office (KIPO), the contents of which are herein incorporated by reference in their entirety.

BACKGROUND OF THE INVENTION

1. Field of the Invention

Example embodiments of the present invention relate to methods of manufacturing a semiconductor device. More particularly, example embodiments of the present invention relate to methods of manufacturing a semiconductor device having a complementary metal-oxide semiconductor (CMOS) transistor.

2. Description of Related Art

As demand for semiconductor devices having high operational speeds and large capacitances increases, semiconductor manufacturing processes have been developed to improve a degree of integration, reliability and/or response speeds of the semiconductor devices. To increase the integration degree of a transistor, a gate insulation layer having a thin equivalent oxide thickness (EOT) has been employed in manufacturing the transistor. When a silicon oxide layer used for forming the gate insulation layer has a physically thin thickness, leakage current between a gate electrode and a channel may increase and a defect in the semiconductor device may result.

A gate electrode formed using a metal increases the response speed. When the gate electrode is formed using polysilicon in a conventional method, threshold voltages (Vth) of an n-type metal-oxide semiconductor (NMOS) transistor and a p-type metal-oxide semiconductor (PMOS) transistor can be adjusted by changing the type and amount of dopants, where the work function of polysilicon varies in accordance with the type and amount of impurities doped into polysilicon. The gate electrode formed using polysilicon may cause a gate depletion problem.

When the gate electrodes of the complementary metal-oxide semiconductor (CMOS) transistor are formed using a metal, the gate depletion problem may be overcome, but threshold voltages of the NMOS transistor and the PMOS transistor cannot be readily adjusted using dopants. For example, the NMOS transistor and the PMOS transistor may be formed by manufacturing the gate electrodes of the NMOS transistor and the PMOS transistor to different thicknesses and/or using different types of metal, respectively. While the gate electrodes of the NMOS transistor and the PMOS transistor, which have different materials and thicknesses, are formed on a substrate, a gate insulation layer or an active region of the substrate adjacent to the gate electrodes may be damaged, for example, by a dry etching process.

A method of forming a CMOS transistor is disclosed in U.S. Patent Application Publication No. 2004/0245578. According to the publication, a buffer layer is formed on a gate dielectric layer, and then a metal layer used for forming a gate electrode of an NMOS transistor is formed on the buffer layer. An additional metal layer is formed on a substrate in a NMOS region and a PMOS region, and the metal layers are patterned by performing an etching process to form gate electrodes in the NMOS region and the PMOS region. The above-mentioned publication merely discloses that damage to the gate dielectric layer is reduced by using the buffer layer formed on the gate dielectric layer.

Therefore, a need exists for a method of manufacturing a semiconductor device having a complementary metal-oxide semiconductor (CMOS) transistor without damaging a substrate and/or a gate insulation layer.

SUMMARY OF THE INVENTION

According to one example embodiment of the present invention, a method of manufacturing a semiconductor device includes forming a gate insulation layer on a substrate including a first channel of a first conductive type and a second channel of a second conductive type substantially different from the first conductive type. A first conductive layer including a first metal is formed on the gate insulation layer, and a second conductive layer including a second metal substantially different from the first metal is formed on the first conductive layer formed over the second channel. The second conductive layer is partially removed by a wet etching process to form a second conductive layer pattern over the second channel.

In an example embodiment of the present invention, the wet etching process may be performed using an etching solution having an etching selectivity of at least about 1:4 between the first conductive layer and the second conductive layer.

In an example embodiment of the present invention, a crystalline structure of the second conductive layer may be weakened by performing at least one of a plasma treatment process and an ion implantation process before partially removing the second conductive layer by the wet etching process.

In an example embodiment of the present invention, the first conductive layer may be formed using a material including at least tantalum, and the second conductive layer may be formed using a material including at least titanium. The wet etching process may be performed using an etching solution including at least a peroxide compound.

According to another example embodiment of the present invention, a method of manufacturing a semiconductor device includes preparing a substrate including a first channel of a first conductive type and a second channel of a second conductive type substantially different from the first conductive type, and forming a gate insulation layer on the substrate. A first conductive layer including a first metal is formed on the gate insulation layer, and a second conductive layer including a second metal substantially different from the first metal is formed on the first conductive layer positioned over the second channel. A third conductive layer is formed on the first conductive layer and the second conductive layer, and the third conductive layer is partially removed to form a third conductive layer pattern on the first conductive layer formed over the first channel and on the second conductive layer formed over the second channel. The second conductive layer is partially removed by a wet etching process to form a second conductive layer pattern over the second channel, and then the first conductive layer is partially removed to form a first conductive layer pattern over the first channel and the second channel.

According to example embodiments of the present invention, dual gate structures of a complementary metal-oxide semiconductor (CMOS) transistor, which includes different types of conductive layers, are formed to have a threshold voltage for operation of a semiconductor device, and also damage to a gate insulation layer and/or an active region of a substrate adjacent to the dual gate structures may be suppressed and/or reduced.

BRIEF DESCRIPTION OF THE DRAWINGS

The present invention will become more apparent by describing in detailed example embodiments thereof with reference to the accompanying drawings, in which.

DETAILED DESCRIPTION OF EMBODIMENTS

Figure 1:
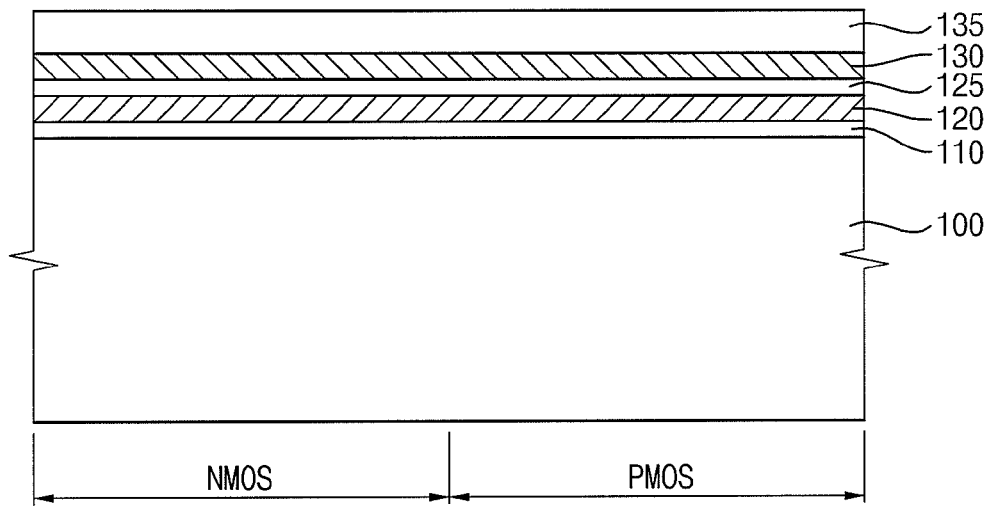
FIGS. 1 through 8 are cross-sectional views illustrating a method of manufacturing a semiconductor device in accordance with example embodiments of the present invention.

The present invention is described more fully hereinafter with reference to the accompanying drawings, in which example embodiments of the present invention are shown. The present invention may, however, be embodied in many different forms and should not be construed as limited to example embodiments set forth herein. Rather, embodiments are provided so that this disclosure will be thorough and complete, and will fully convey the scope of the present invention to those skilled in the art. In the drawings, the size and relative sizes of layers and regions may be exaggerated for clarity.

FIGS. 1 through 8 are cross-sectional views illustrating a method of manufacturing a semiconductor device in accordance with example embodiments of the present invention.

Referring to FIG. 1, a substrate 100 having an n-type metal-oxide semiconductor (NMOS) region, in which an n-type transistor is formed, and a p-type metal-oxide semiconductor (PMOS) region, in which a p-type transistor is formed, is prepared. An n-type channel (not shown) of the n-type transistor is formed at an upper portion of the substrate 100 in the NMOS region through subsequent processes, and a p-type channel (not shown) of the p-type transistor is formed at an upper portion of the substrate 100 in the PMOS region through subsequent processes. Additionally, an isolation layer (not shown) is formed on the substrate 100 by an isolation process to divide the substrate 100 into an active region (not shown) and a field region (not shown).

A gate insulation layer 110 is formed on the substrate 100 having the NMOS region and the PMOS region. The gate insulation layer 110 may be formed by an atomic layer deposition (ALD) process and/or a chemical vapor deposition (CVD) process. For example, the gate insulation layer 110 may be formed using silicon oxide ($SiO_2$), silicon oxynitride (SiON) or a high dielectric material having a dielectric constant substantially higher than that of silicon oxide. An example of the high dielectric material may include a hafnium-containing material. Examples of the high dielectric material having hafnium may include hafnium oxide, hafnium aluminum oxide, hafnium silicon oxide, hafnium oxynitride, hafnium aluminum oxynitride, hafnium silicon oxynitride or the like. Examples of a hafnium precursor that may be employed in forming the gate insulation layer 110 may include hafnium chloride, hafnium alkoxide, alkylamino hafnium, alkoxy-alkylamino hafnium or the like. Examples of an oxidizing agent that may be employed in forming the gate insulation layer 110 may include water vapor, oxygen gas, ozone gas or an oxygen radical, etc. Additionally, examples of a silicon source that may be employed in forming the gate insulation layer 110 may include silane, dichlorosilane or a combination thereof, and examples of an aluminum precursor may include trimethyl aluminum, aluminum chloride or the like.

In some example embodiments of the present invention, a thermal treatment may be performed on the substrate having the gate insulation layer 110 to densify the gate insulation layer 110. For example, the thermal treatment may be performed at a temperature ranging from about 750° C. to about 1,050° C. In addition, the thermal treatment may be performed in an atmosphere including nitrogen gas ($N_2$), nitric oxide gas (NO), nitrous oxide gas ($N_2O$), oxygen gas ($O_2$), ammonia gas ($NH_3$) or combinations thereof.

In some example embodiments of the present invention, an interface layer (not shown) may be formed on the substrate 100 before forming the gate insulation layer 110. The interface layer may be formed by treating the substrate 100, such as a silicon wafer or a silicon-on-insulator (SOI) substrate, with an oxidizing agent. Examples of the oxidizing agent may include ozone vapor or a solution including ozone. For example, the interface layer may be formed to have a thickness of less than about 1.5 nm.

A first conductive layer 120 is formed on the gate insulation layer 110 in the NMOS region and PMOS region. The first conductive layer 120 may include a first metal. Examples of the first metal may include transition metals in Groups 4 (IV B), 5 (V B) and 6 (VI B) of the periodic table, aluminum or combinations thereof. For example, the first metal may be tantalum, titanium, zirconium, hafnium, molybdenum, tungsten, aluminum or the like. Additionally, the first conductive layer 120 may be a metal film including the first metal, a metal nitride film including the first metal or a metal silicide film including the first metal. The first conductive layer 120 may be formed by a CVD process, an ALD process and/or a sputtering process. In an example embodiment of the present invention, the first conductive layer 120 may be formed using tantalum nitride. In addition, the first conductive layer 120 may be formed to have a thickness of less than about 50 Å. The first conductive layer 120 may be formed to have a thickness as thin as possible to improve the threshold voltage of the NMOS transistor.

A preliminary second conductive layer 130 is formed on the first conductive layer 120 in the NMOS region and the PMOS region. The preliminary second conductive layer 130 may include a second metal substantially different from the first metal. Examples of the second metal may include transition metals in Groups 4 (IV B), 5 (V B) and 6 (VI B) of the periodic table, aluminum or combinations thereof. For example, the second metal may be titanium, zirconium, hafnium, tantalum, molybdenum, tungsten, aluminum or the like. Additionally, the preliminary second conductive layer 130 may be a metal film including the second metal, a metal nitride film including the second metal or a metal silicide film including the second metal. The preliminary second conductive layer 130 may be formed by a CVD process, an ALD process and/or a sputtering process. In an example embodiment of the present invention, the preliminary second conductive layer 130 may be formed using titanium nitride.

In some example embodiments of the present invention, a preliminary thin film 125 may be formed on the first conductive layer 120 in the NMOS region and the PMOS region before forming the preliminary second conductive layer 130. The preliminary thin film 125 may be formed using a metal oxide and/or a metal nitride. The preliminary thin film 125 may be formed by a CVD process, an ALD process and/or a sputtering process. In an example embodiment of the present invention, the preliminary thin film 125 may be formed by depositing aluminum oxide or aluminum nitride through an ALD process. For example, the preliminary thin film 125 having aluminum oxide may be formed using water vapor or ozone together with trimethyl aluminum, and the preliminary thin film 125 having aluminum nitride may be formed using trimethyl aluminum and ammonia.

A first mask layer 135 is formed on the preliminary second conductive layer 130 in the NMOS region and the PMOS region. The first mask layer 135 may be formed of silicon oxide, silicon nitride, silicon oxynitride, silicon or the like. In an example embodiment of the present invention, the first mask layer 135 may be formed by depositing silicon oxide at a low temperature through an ALD process. For example, when the gate insulation layer 110 is formed using a material having high oxygen diffusivity, such as hafnium oxide, the first mask layer 135 may be advantageously formed at a low temperature of less than about 400° C. When the first mask layer 135 is formed at a temperature substantially higher than the above-mentioned temperature, an oxide layer may be formed between the substrate 100 and the gate insulation layer 110. Additionally, a thermal treatment may be performed on the substrate 100, on which the first mask layer 135 is formed, at a temperature of less than about 400° C. to thereby densify or harden the first mask layer 135.

A photoresist film (not shown) is formed on the first mask layer 135, and a photolithography process is performed on the photoresist film to form a photoresist pattern (not shown) exposing a portion of the first mask layer 135 in the NMOS region.

Figure 2:
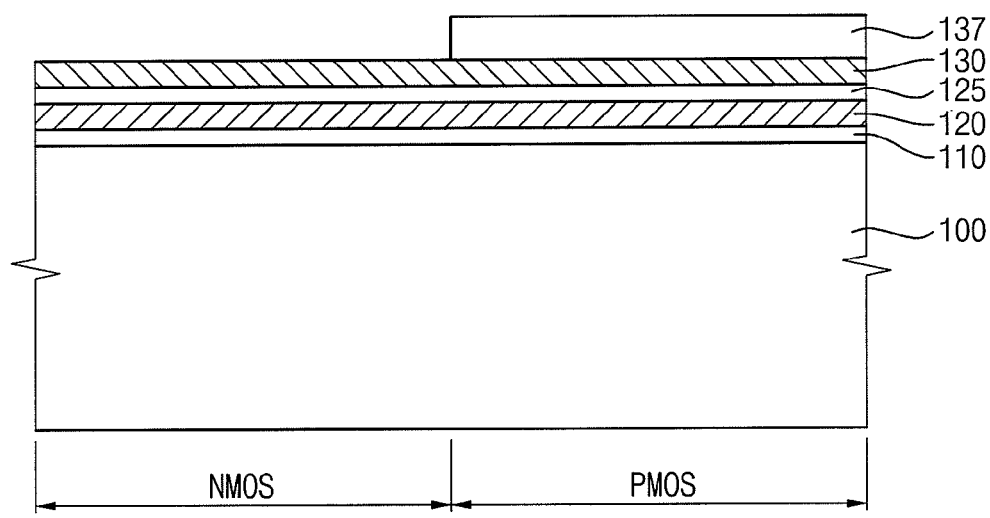

Referring to FIG. 2, the first mask layer 135 formed in the NMOS region is removed using the photoresist pattern as an etching mask. As a result, a first mask pattern 137 is formed on the preliminary second conductive layer 130 in the PMOS region to expose a portion of the preliminary second conductive layer 130 in the NMOS region. Thereafter, the photoresist pattern is removed from the substrate 100 by performing an ashing process and/or a stripping process.

Figure 3:
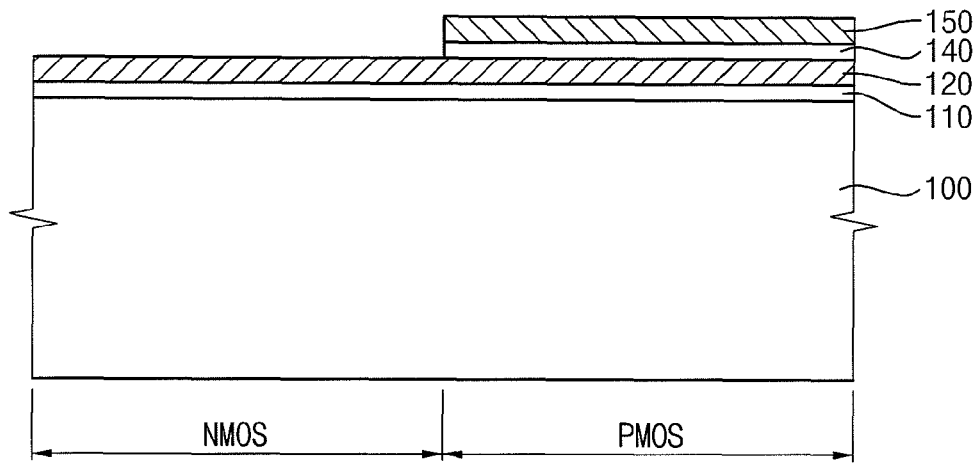

Referring to FIG. 3, the preliminary second conductive layer 130 and the preliminary thin film 125 in the NMOS region are sequentially etched using the first mask pattern 137 as an etching mask to form a second conductive layer 150 and a thin film 140 on the first conductive layer 120 in the PMOS region. The preliminary second conductive layer 130 and the preliminary thin film 125 may be etched using either a dry etching process or a wet etching process. To substantially prevent the first conductive layer 120 from being damaged by plasma, the preliminary second conductive layer 130 and the preliminary thin film 125 may be etched by a wet etching process. For example, when the preliminary second conductive layer 130 is formed using titanium nitride, the wet etching process may be carried out using a standard cleaning solution (SC-1) solution including ammonium hydroxide, hydrogen peroxide and water. After forming the second conductive layer 150 and the thin film 140 on the first conductive layer 120 in the PMOS region, the first mask pattern 137 in the PMOS region is removed from the substrate 100.

Figure 4:
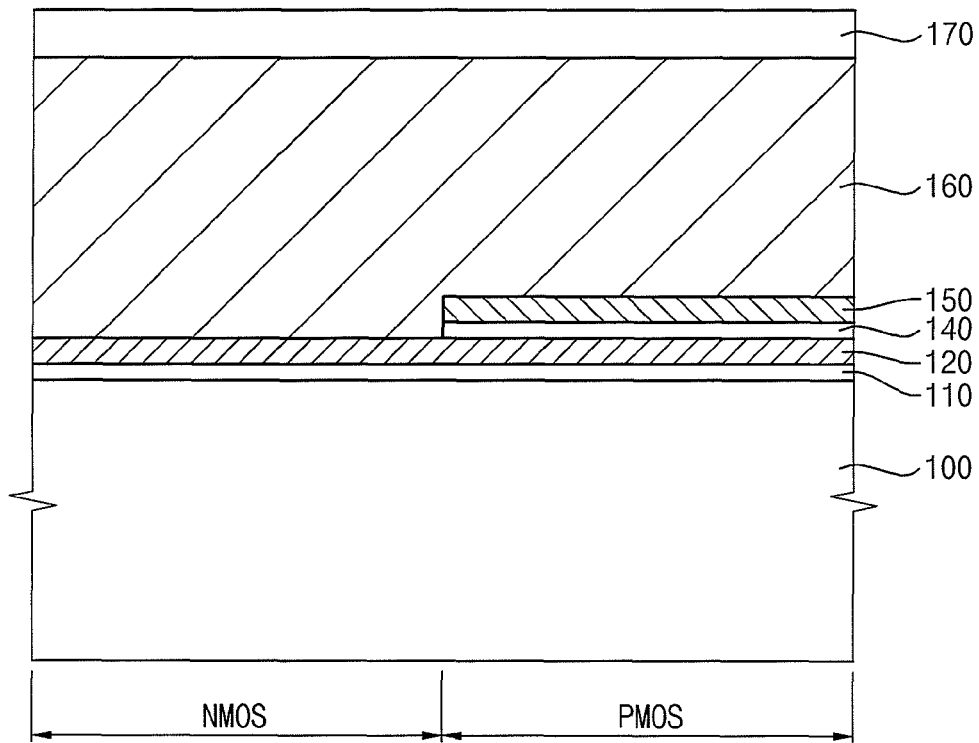

Referring to FIG. 4, a third conductive layer 160 and a second mask layer 170 are sequentially formed on the first conductive layer 120 in the NMOS region and the second conductive layer 150 in the PMOS region. In an example embodiment of the present invention, the third conductive layer 160 may be formed using polysilicon or polysilicon doped with impurities. The third conductive layer 160 may be formed to have a thickness substantially greater than those of the second conductive layer 150 and the thin film 140. For example, the third conductive layer 160 may have a thickness about five times to about ten times thicker than the sum of thicknesses of the second conductive layer 150 and the thin film 140.

The second mask layer 170 may be formed using silicon oxide, silicon nitride, silicon oxynitride or the like. A photoresist film (not shown) is formed on the second mask layer 170, and then etched by a photolithography process to form a photoresist pattern (not shown) on the second mask layer 170.

Figure 5:
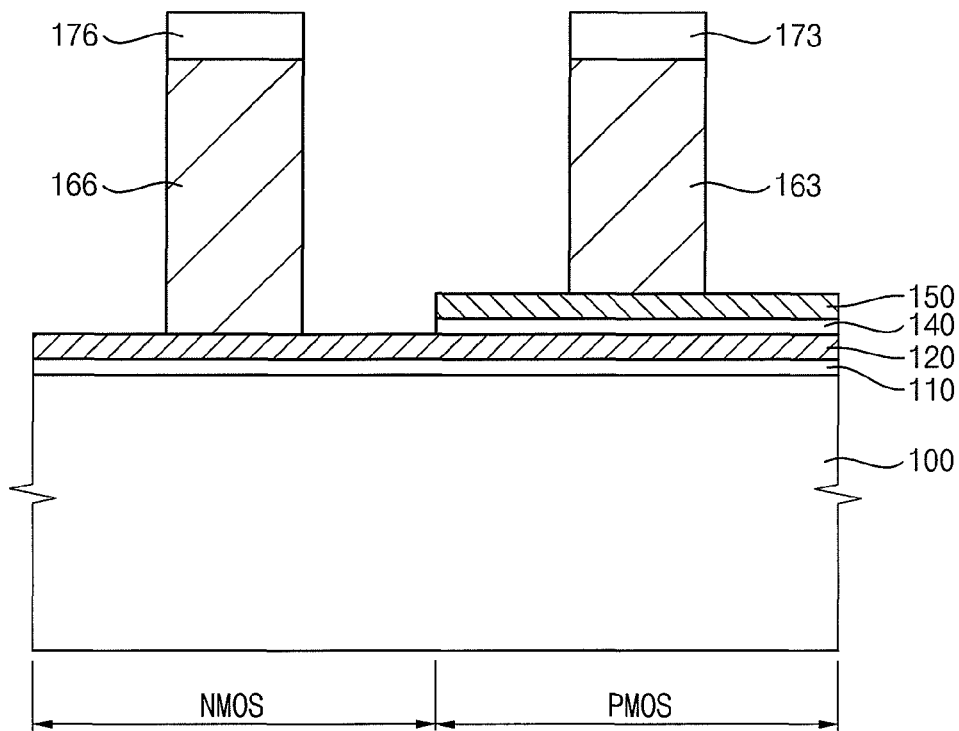

Referring to FIG. 5, the second mask layer 170 is etched using the photoresist pattern as an etching mask to form second mask patterns 173 and 176 on the third conductive layer 160 in the PMOS region and the NMOS region, respectively. The photoresist pattern is removed from the substrate 100 by performing an ashing process and/or a stripping process. The third conductive layer 160 is partially etched using the second mask patterns 173 and 176 as an etching mask to form third conductive layer patterns 163 and 166 in the PMOS region and the NMOS region, respectively. In example embodiments of the present invention, the third conductive layer patterns 163 and 166 may be formed by performing a reactive ion etching (RIE) process.

Figure 6:
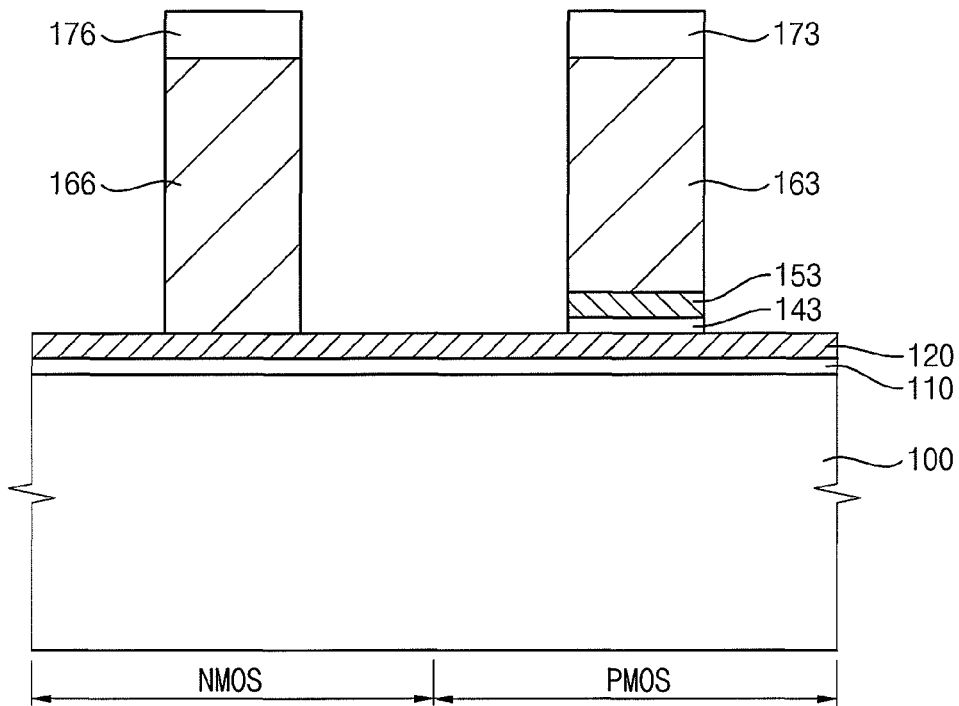

Referring to FIG. 6, the second conductive layer 150 and the thin film 140 in the PMOS region are sequentially patterned to form a second conductive layer pattern 153 and a thin film pattern 143 in the PMOS region. The second conductive layer 150 and the thin film 140 may be patterned by performing a wet etching process. The wet etching process may be carried out using an etching solution, which may selectively remove exposed portions of the second conductive layer 150 and the thin film 140 from the substrate 100, and also may not damage the first conductive layer 120, the third conductive layer patterns 163 and 166, and/or the second mask patterns 173 and 176.

In some example embodiments of the present invention, the wet etching process may be carried out using an etching solution that has an etching selectivity of at least about 1:4 between the first conductive layer 120 and the second conductive layer 150. For example, when the first conductive layer 120 includes tantalum nitride and the second conductive layer 150 includes titanium nitride, the wet etching process may be performed using an etching solution that includes a peroxide compound. Examples of the peroxide compound may include hydrogen peroxide, sodium peroxide, barium peroxide, calcium peroxide, potassium peroxide, benzoyl peroxide or the like. An example of the etching solution including the peroxide compound may be an SC-1 that includes hydrogen peroxide, ammonium hydroxide and water. However, the above-mentioned etching solutions are not intended to be limiting, and the etching solution may be selected considering the etching selectivity between the first conductive layer 120 and the second conductive layer 150.

In example embodiments of the present invention, a plasma treatment and/or an ion implantation may be performed on exposed portions of the second conductive layer 150 in the PMOS region to weaken a crystalline structure of the exposed portions of the second conductive layer 150. For example, the crystalline structure of the second conductive layer 150 may be weakened by using oxygen plasma, argon plasma, helium plasma, neon plasma, silicon plasma, germanium plasma, fluorine plasma, chlorine plasma, bromine plasma, indium plasma or the like. Additionally, the crystalline structure of the second conductive layer 150 may be weakened by implanting ions such as oxygen ions, argon ions, helium ions, neon ions, silicon ions, germanium ions, fluorine ions, chlorine ions, bromine ions, indium ions, or the like. The exposed portion of the second conductive layer 150 may become amorphous or have a weakened structure through the plasma treatment and/or the ion implantation. Therefore, the exposed portions of the second conductive layer 150 may be more readily removed from the substrate 100 through the wet etching process.

Figure 7:
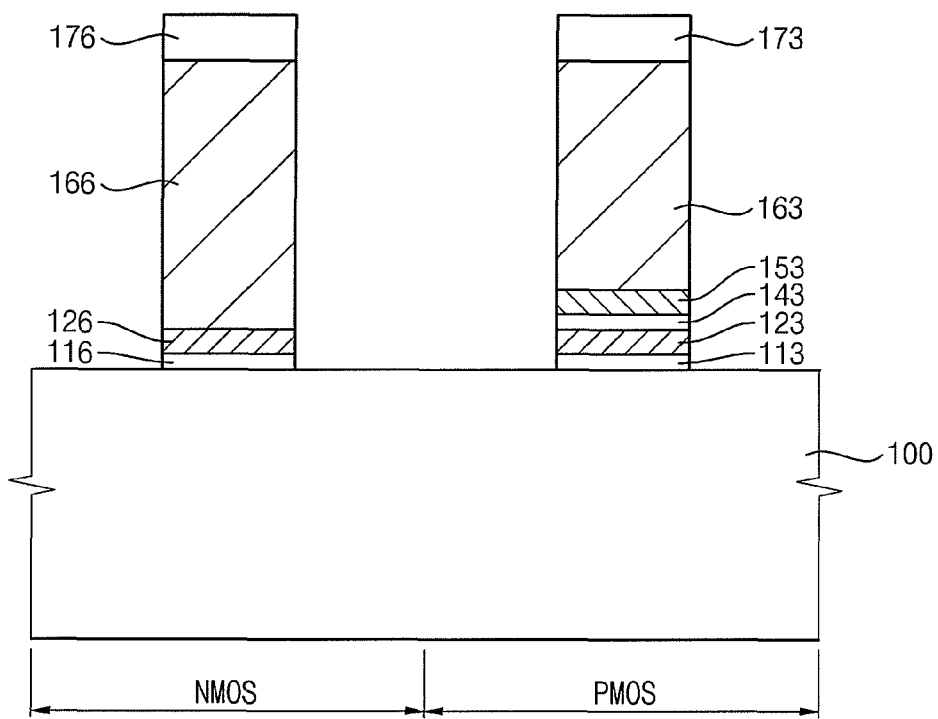

Referring to FIG. 7, the first conductive layer 120 and the gate insulation layer 110 in the PMOS region and the NMOS region are sequentially patterned to form first conductive layer patterns 123 and 126 and gate insulation layer patterns 113 and 116 in the PMOS region and the NMOS region, respectively. The first conductive layer 120 and the gate insulation layer 110 may be patterned by performing a dry etching process such as an RIE process. For example, the first conductive layer 120 may be etched by a dry etching process using fluorine plasma, chlorine plasma, bromine plasma, or the like. In an example embodiment of the present invention, the first conductive layer 120 and the gate insulation layer 110 may be patterned by performing a dry etching process and a subsequent wet etching process.

Figure 8:
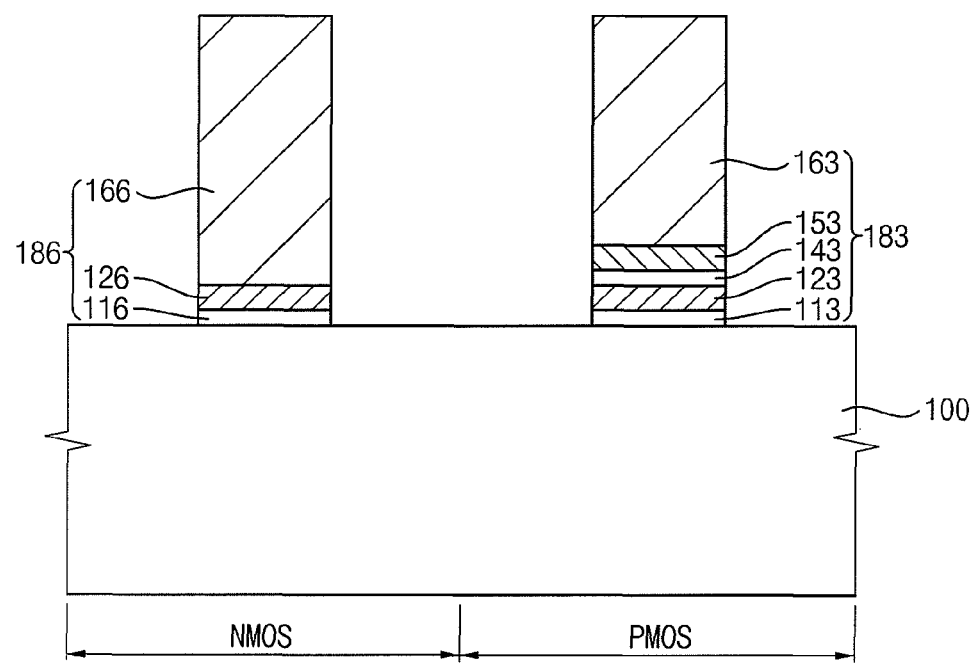

Referring to FIG. 8, the second mask patterns 173 and 176 are removed from the substrate 100 to form gate structures 183 and 186 in the PMOS region and the NMOS region, respectively. The gate structure 183 formed in the PMOS region includes the gate insulation layer pattern 113, the first conductive layer pattern 123, the thin film pattern 143, the second conductive layer pattern 153 and the third conductive layer pattern 163. The gate structure 186 formed in the NMOS region includes the gate insulation layer pattern 116, the first conductive layer pattern 126 and the third conductive layer pattern 166.

Although not illustrated in the drawings, a gate spacer may be formed on sidewalls of the gate structures 183 and 186. Additionally, impurities are implanted into upper portions of the substrate 100 adjacent to the gate structures 183 and 186 to form source/drain regions (not shown) on the substrate 100 in the PMOS region and the NMOS region. For example, n-type impurities may be implanted into the substrate 100 of the NMOS region and p-type impurities may be implanted into the substrate 100 of the PMOS region. Accordingly, an NMOS transistor having an n-type channel is formed in the NMOS region and a PMOS transistor having a p-type channel is formed in the PMOS region. As a result, a complementary metal-oxide semiconductor (CMOS) transistor may be manufactured on the substrate 100.

The present invention will hereinafter be further described through Examples and Comparative Examples. However, these are illustrative of the present invention, and are not intended to be limiting of the present invention.

Evaluation of Damage to an Active Region in Accordance with Etching Methods

Example 1

Gate structures were manufactured on a silicon wafer in accordance with the methods described with reference to FIGS. 1 to 8. An isolation process was carried out on the silicon wafer to divide the silicon wafer into an active region and a field region. In an NMOS region, a gate insulation layer, a first conductive layer, a third conductive layer and a mask layer were sequentially formed on the silicon wafer. In a PMOS region, a gate insulation layer, a first conductive layer, an aluminum oxide layer, a second conductive layer, a third conductive layer and a mask layer were sequentially formed on the silicon wafer. The gate insulation layer was formed using hafnium silicon oxynitride, the first conductive layer was formed using tantalum nitride, the second conductive layer was formed using titanium nitride, the third conductive layer was formed using polysilicon and the mask layer was formed using silicon oxynitride.

After forming a photoresist film on the mask layer, the photoresist film was etched by a photolithography process to form a photoresist pattern on the mask layer. The mask layer was partially etched using the photoresist pattern as an etching mask, and the third conductive layer in the NMOS region and the PMOS region was patterned using the mask pattern as an etching mask. The third conductive layer was partially etched by an RIE process until the first conductive layer in the NMOS region and the second conductive layer in the PMOS region were exposed. As a result, third conductive patterns were formed in the NMOS region and the PMOS region.

The second conductive layer and the aluminum oxide layer in the PMOS region were etched using an SC-1 solution that included hydrogen peroxide, ammonium hydroxide and water in a volume ratio of about 1:1:5. As a result, a second conductive layer pattern and an aluminum oxide layer pattern were formed in the PMOS region. The first conductive layer and the gate insulation layer in the NMOS region and the PMOS region were partially etched by an RIE process to form first conductive layer patterns and gate insulation layer patterns in the NMOS region and the PMOS region. A gate spacer was formed on sidewalls of the gate structures in the NMOS region and the PMOS region. The gate structures were cross-sectioned, and cross-sectional views of the gate structures were observed using an electron microscope for any damage to the active region of the silicon wafer.

Comparative Example 1

In the NMOS region, a gate insulation layer, a first conductive layer, a third conductive layer and a mask layer were sequentially formed on a silicon wafer through processes substantially the same as those of Example 1. Additionally, in the PMOS region, a gate insulation layer, a first conductive layer, an aluminum oxide layer, a second conductive layer, a third conductive layer and a mask layer were sequentially formed on the silicon wafer through processes substantially the same as those of Example 1. The mask layer was partially etched to form a mask pattern in the NMOS region and the PMOS region. The third conductive layer, the second conductive layer, the aluminum oxide layer, the first conductive layer and the gate insulation layer were sequentially patterned using the mask pattern as an etching mask to form gate structures in the NMOS region and the PMOS region. This patterning was carried out by an RIE process until the silicon wafer in the PMOS region was exposed. The gate structures were cross-sectioned, and cross-sectional views of the gate structures were observed using an electron microscope for any damage to the active region of the silicon wafer.

Figure 9:
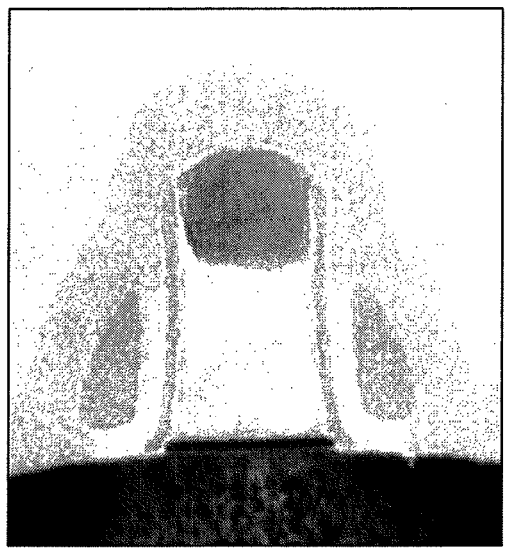
FIGS. 9 and 10 are electron microscope images showing cross-sections of the gate structures formed in the n-type metal-oxide semiconductor (NMOS) region and the p-type metal-oxide semiconductor (PMOS) region prepared in Example 1, respectively.
Figure 10:
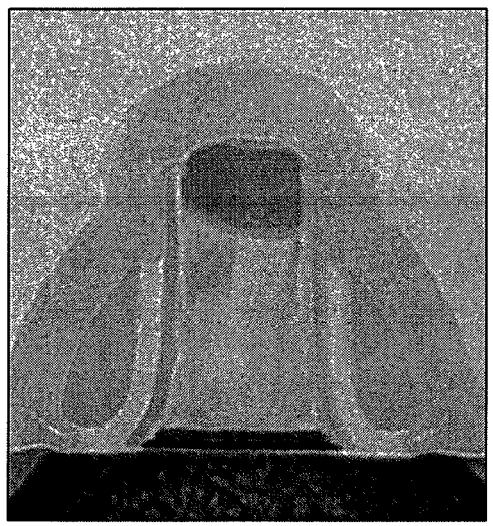
Figure 11:
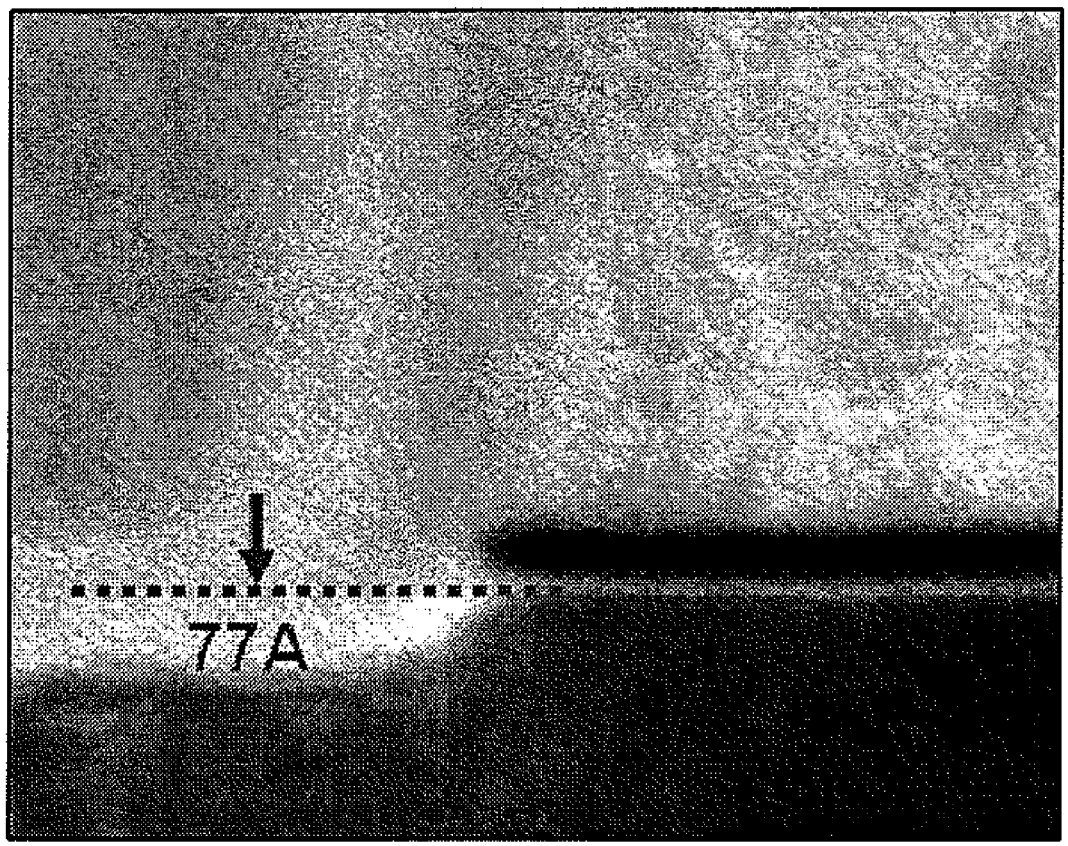
FIG. 11 is an electron microscope image showing a cross-section of the gate structure formed in the NMOS region prepared in Comparative Example 1.

FIGS. 9 and 10 are electron microscope images showing cross-sections of the gate structures formed in the NMOS region and the PMOS region prepared in Example 1, respectively. FIG. 11 is an electron microscope image showing a cross-section of the gate structure formed in the NMOS region prepared in Comparative Example 1.

As shown in FIG. 11, the active region of the silicon wafer adjacent to the gate structure formed in the NMOS region, which was prepared in Comparative Example 1, was damaged. Thus, it may be noted that when the gate structures in the NMOS region and the PMOS region include different types of layers and had different thicknesses, patterning the gate structures through a single dry etching process may generate damage to the active region of a substrate. A source/drain will be formed in the active region of the substrate adjacent to the gate structures, and thus damage to the active region may cause a defect in a semiconductor device.

As shown in FIGS. 9 and 10, the silicon wafer adjacent to the gate structures formed in the NMOS region and the PMOS region, which were prepared in Example 1, was not damaged. Therefore, it may be noted that damage to the active region may be substantially prevented by patterning the second conductive layer and the aluminum oxide layer in the PMOS region through an additional wet etching process between dry etching processes.

Evaluation of Etching Rates in Accordance with Types of Conductive Layers

Etching rates of a tantalum nitride layer and a titanium nitride layer were evaluated for wet etching solutions. An SC-1 solution including hydrogen peroxide, ammonium hydroxide and water in a volume ratio of about 1:1:5 and a hydrofluoric aqueous solution having an HF concentration of about 2% were used for the wet etching process. Etching rates of the tantalum nitride layer and the titanium nitride layer are shown in Table 1.

TABLE 1

| | Etching Rate [Å/min] | | |
|---|---|---|---|
| | Tantalum nitride | Titanium nitride | Etching Selectivity (TaN:TiN) |
| SC-1 solution | 0.5 | 28 | 1:56 |
| HF solution | 6 | 20 | 1:3.3 |

As shown in Table 1, the SC-1 solution having hydrogen peroxide had an etching selectivity of about 1:56 between the TaN layer and the TiN layer, and the HF solution had an etching selectivity of about 1:3.3. Thus, the SC-1 solution having hydrogen peroxide has a comparative ability to selectively etch the titanium nitride layer relative to the tantalum nitride layer, compared with the HF solution not including a peroxide compound. Accordingly, it may be noted that the etching solution including a peroxide compound such as hydrogen peroxide may be employed in selectively etching a titanium nitride from a semiconductor substrate having an exposed tantalum nitride layer.

According to example embodiments of the present invention, dual gate structures of a CMOS transistor, which includes different types of conductive layers, may be formed to have a threshold voltage needed for operation of a semiconductor device, and damage to a gate insulation layer and/or an active region of a substrate adjacent to the dual gate structures may be suppressed and/or reduced. That is, conductive layers formed in the NMOS region and the PMOS region, which have different types of layers and thicknesses, may be patterned by sequentially performing a first dry etching process, a selective wet etching process and a second drying etching process, and thus the dual gate structure may be formed on the substrate substantially without causing damage to the active region of the substrate and/or the gate insulation layer.

The foregoing is illustrative of the present invention and is not to be construed as limiting thereof. Although example embodiments of the present invention have been described, those skilled in the art will readily appreciate that many modifications are possible without materially departing from the teachings of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device comprising:
    preparing a substrate including a first channel of a first conductive type and a second channel of a second conductive type different from the first conductive type;
    forming a gate insulation layer on the substrate;
    forming a first conductive layer including a first metal on the gate insulation layer;
    forming a second conductive layer including a second metal on the first conductive layer formed over the second channel, the second metal being different from the first metal;
    forming a third conductive layer on the first conductive layer and the second conductive layer;
    partially removing the third conductive layer by a dry etching process to form third conductive layer patterns on the first conductive layer formed over the first channel and on the second conductive layer formed over the second channel;
    partially removing the second conductive layer by a wet etching process to form a second conductive layer pattern over the second channel; and
    partially removing the first conductive layer to form first conductive layer patterns over the first channel and the second channel.

2. The method of claim 1, wherein the first metal and the second metal respectively comprise one selected from the group consisting of transition metals in Groups 4 (IV B), 5 (V B) and 6 (VI B) of the periodic table, and aluminum.

3. The method of claim 1, wherein the first conductive layer is formed using a material including at least tantalum.

4. The method of claim 1, wherein the second conductive layer is formed using a material including at least titanium, and the wet etching process is performed using an etching solution including at least a peroxide compound.

5. The method of claim 1, wherein the gate insulation layer is formed using at least one selected from the group consisting of hafnium oxide, hafnium aluminum oxide, hafnium silicon oxide, hafnium oxynitride, hafnium aluminum oxynitride and hafnium silicon oxynitride.

6. The method of claim 1, wherein the first conductive type is an n-type and the second conductive type is a p-type.

7. The method of claim 1, wherein the third conductive layer pattern and the first conductive layer pattern are formed by performing dry etching processes, respectively.

8. The method of claim 1, further comprising weakening a crystalline structure of the second conductive layer through a plasma treatment process and/or an ion implantation process prior to partially removing the second conductive layer by the wet etching process.

9. The method of claim 1, further comprising forming a thin film on the first conductive layer formed over the second channel using at least one of a metal oxide and a metal nitride.

10. The method of claim 9, further comprising partially removing the thin film by the wet etching process to form a thin film pattern on the first conductive layer formed over the second channel.

11. The method of claim 1, wherein forming the second conductive layer on the first conductive layer formed over the second channel comprises:

forming a preliminary second conductive layer on the first conductive layer formed over the first channel and the second channel;

forming a mask layer on the preliminary second conductive layer formed over the second channel; and etching the preliminary second conductive layer using the mask layer as an etching mask to form the second conductive layer on the first conductive layer over the second channel.

12. The method of claim 1, wherein the third conductive layer is formed using polysilicon.

* * * * *